(12) United States Patent
Hiraoka et al.

(10) Patent No.: US 6,432,538 B1
(45) Date of Patent: Aug. 13, 2002

(54) CARBON FIBER REINFORCED CARBON COMPOSITE AND USEFUL AS COMPONENTS FOR PULLING SINGLE CRYSTAL APPARATUS

(75) Inventors: Toshiharu Hiraoka; Naoto Ohta, both of Kagawa; Akira Asari, Osaka; Toshiaki Sogabe, Kagawa, all of (JP)

(73) Assignee: Toyo Tanso Co., Ltd., Osaka (JP)

( * ) Notice: Subject to any disclaimer, the term of this patent is extended or adjusted under 35 U.S.C. 154(b) by 0 days.

(21) Appl. No.: 09/493,016

(22) Filed: Jan. 28, 2000

(51) Int. Cl.[7] .................................. B32B 9/00
(52) U.S. Cl. .................... 428/408; 428/293.4; 428/375; 428/902; 427/227; 427/228; 427/249.1; 264/29.5
(58) Field of Search .................. 428/408, 367, 428/375, 902, 293.4; 264/29.5; 427/227, 228, 249.1, 252

(56) References Cited

U.S. PATENT DOCUMENTS

| | | |
|---|---|---|
| 5,616,175 A | 4/1997 | Walsh |
| 5,683,281 A | 11/1997 | Metter |
| 5,800,924 A | 9/1998 | Metter |

FOREIGN PATENT DOCUMENTS

| | | |
|---|---|---|
| EP | 0 913 504 | 5/1999 |
| FR | 2 757 182 | 6/1998 |
| WO | WO 91/04954 | 4/1991 |

OTHER PUBLICATIONS

Patent Abstracts of Japan, vol. 1998, No. 11, Sep. 30, 1998, JP 10 158090, Jun. 16, 1998.
Patent Abstracts of Japan, vol. 1998, No. 08, Jun. 30, 1998, JP 10 059795, Mar. 3, 1998.

Primary Examiner—Deborah Jones
Assistant Examiner—Abraham Bahta
(74) Attorney, Agent, or Firm—Oblon, Spivak, McClelland, Maier & Neustadt, P.C.

(57) ABSTRACT

A carbon fiber reinforced carbon composite, obtained by a method comprising impregnating a pitch or a resin into a molded member formed of carbon fibers for densification thereof; forming an impregnated pyrolytic carbon layer by CVI after densification; and forming a coated pyrolytic carbon layer on the impregnated pyrolytic carbon layer by CVD; a method of making the carbon fiber reinforced carbon composite; and a pulling single crystal member made from the carbon fiber reinforced carbon composite.

16 Claims, 2 Drawing Sheets

| | DENSITY OF PyC AFTER TREATED (g/cm³) | | | AVERAGE SURFACE ROUGHNESS (μm) | RAPID HEATING & COOLING EXAMINATION (EXFOLIATING) | REACTING RATE WITH SiO GAS (%) |
|---|---|---|---|---|---|---|
| | CVI | CVD | DIFFERENCE | | | |
| EXAMPLE 1 | 2.05 | 2.15 | 0.1 | 1.9 | NO | 1.4 |
| EXAMPLE 2 | 2.05 | 1.85 | 0.2 | 2.0 | NO | 1.6 |
| EXAMPLE 3 | 2.05 | 2.15 | 0.1 | 5.0 | NO | 1.7 |
| COMPARATIVE EXAMPLE 1 | - | 2.10 | - | 5.0 | YES | 1.8 |
| COMPARATIVE EXAMPLE 2 | 2.05 | | - | 7.0 | - | 4.5 |
| COMPARATIVE EXAMPLE 3 | - | - | - | - | - | 11.0 |

*FIG. 2*

CARBON FIBER REINFORCED CARBON COMPOSITE AND USEFUL AS COMPONENTS FOR PULLING SINGLE CRYSTAL APPARATUS

TECHNICAL FIELD

The present invention is directed to a carbon fiber reinforced carbon composite (C/C composite). More particularly, the present invention is directed to the C/C composite with impregnated and coated pyrolytic carbon.

BACKGROUND ART

The size of a pulling single crystal apparatus for the Czochralski (CZ) method has seen a recent trend of increasing with increasing diameter of the single crystal. The structural elements for use under a high temperature atmosphere have been made of a high-density and a high-purity isotropic graphite with high mechanical properties under high temperature. The size of the graphite elements is also increasing with the size of the CZ apparatus. This produces a handling problem caused by the increased weight of the existing graphite elements and a problem of reduction in effective processing size of the inside of the apparatus.

The C/C composite has many excellent properties of lightweight and strong mechanical strength, as compared with the graphite material. By virtue of these properties, even when reduced in thickness, the structural elements of the C/C composite can have a strength equal to that of the graphite material, to enable its effective use for a processing chamber of the apparatus. In addition, by virtue of being lightweight, good handling can be achieved in, for example, placement in the apparatus. By virtue of these properties, the crucible components used in the CZ apparatus having a large diameter are now moving from those made of graphite to those made of a C/C composite.

However, the C/C composite has a large specific surface area and a large diameter of pores. Accordingly, the C/C composite reacts with SiO gas in the apparatus easily and the reacting rate to silicon carbide (SiC) is faster than that of graphite.

The inventors have proposed a C/C composite with impregnated and coated pyrolytic carbon (PyC) by CVI (Chemical Vapor Infiltration) for a crucible of the CZ apparatus in PCT WO97-49844 in order to prevent reacting with SiO gas. In the C/C composite with impregnated and coated PyC by CVI, the impregnated PyC layer is formed deep, but the coated PyC layer is formed thin. Consequently, the C/C composite can not prevent reaction with SiO gas and formation of SiC. In the C/C composite with impregnated and coated PyC by only CVD (Chemical Vapor Deposition), the coated PyC layer is formed thick, but the impregnated PyC layer is formed shallow. Consequently, the C/C composite can prevent reaction with SiO gas, but when the coated PyC on the surface is worn out, the C/C composite is going to change to SiC due to the impregnated PyC layer being thin. Accordingly, the C/C composite with impregnated and coated PyC by CVD has safety problems when applied to the pulling single crystal apparatus.

DISCLOSURE OF THE INVENTION AS CLAIMED

It is the objective of the present invention to provide a C/C composite with high resistance to reacting to form SiC, by impregnating and coating PyC by CVI and CVD continuously, and a pulling single crystal apparatus of the C/C composite.

The present invention therefore provides a C/C composite, obtained by a method comprising: impregnating a pitch or a resin into a molded member formed of carbon fibers for densification thereof; forming an impregnated PyC layer by CVI in a furnace after densification; and forming a coated PyC layer continuously on the impregnated PyC layer by CVD without taking the C/C composite out from the furnace after CVI. The molded member can be subjected to high purification under a halogen gas atmosphere at 2,000 to 2,500° C. before CVI. A density difference between the impregnated layer and the coated layer of PyC of the C/C composite is not more than 0.2 $g/cm^3$, and more preferably 0.1 $g/cm^3$. A thickness of the coated PyC layer is 10 to 100 $\mu m$, more preferably 20 to 80 $\mu m$. An average surface roughness of the coated PYC layer is not more than 5 $\mu m$.

The surfaces of the CVD coated PyC can be formed very smooth due to gaps in the carbon fibers on the surface being filled with the impregnated PyC by CVI. Due to the density difference between the impregnated layer and the coated layer of PyC of the C/C composite being not more than 0.2 $g/cm^3$, and more preferably 0.1 $g/cm^3$, the resistance to delaminating of the PyC coated layer increases due to the disappearance of a definite boundary between the impregnated layer and the coated layer. Due to the thickness of the coated PyC layer being 10 to 100 $\mu m$, more preferably 20 to 80 $\mu m$, SiO gas can be prevented from penetrating into the inside of the C/C composite. Furthermore, due to the average surface roughness of the coated PyC layer being not more than 5 $\mu m$, the C/C composite can be prevented from reacting to form SiC, in view of a decrease in the contact surface area with SiO gas.

The impregnated PyC layer and the coated PyC layer are formed continuously by CVD after CVI in the same furnace without removal from the furnace after CVI. Accordingly, a clear boundary between the impregnated PyC layer and the coated PyC layer does not appear, and there are no impurities in the boundary of the impregnated PyC layer and the coated PyC layer due to never exposing in the air.

The present invention therefore provides a pulling single crystal apparatus made from a high purity C/C composite with high resistance to reacting to form SiC by the impregnated and coated PyC by CVI and CVD continuously.

BRIEF DESCRIPTION OF THE DRAWINGS

FIG. 2 shows characteristics of the C/C composite of the present invention.

DETAILED DESCRIPTION OF THE EMBODIMENT

Figure 1:
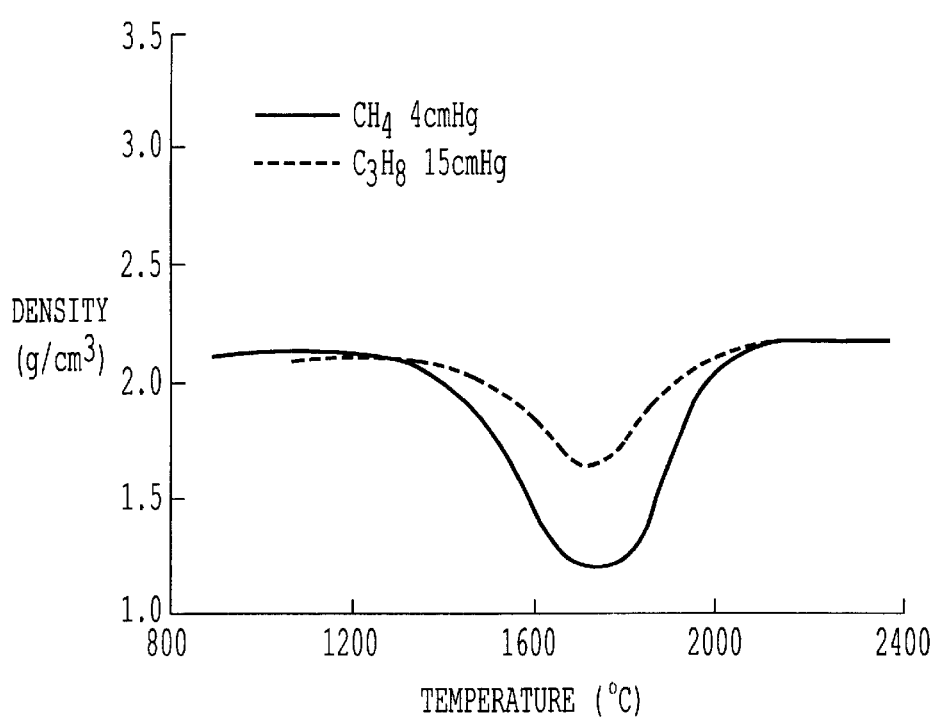
FIG. 1 is a relationship between deposition temperature and density of pyrolytic carbon.

For the C/C composite of the present invention, for example, UD (Uniaxial Dimension) or 2-D (2 directional Dimensions) cloth made of carbon fibers of pitch or polyacrylonitrile (PAN) may be used as starting carbon fibers. Then, the carbon fibers are heated for purposes of solidification after laminating a prepreg made from the carbon fibers impregnated with a resin or molding member by filament winding of the resin-impregnated carbon fibers to form a member. Also, 3-D or n-D cloth impregnated with the resin that is heated to form a member may also be used. When laminating, the carbon fibers contacting with quartz crucible layer are forming 1K cloth, which has a higher density and finer filament compared to a 3K cloth, resulting in better protection from oxidation when SiO gas penetrates inside the C/C composite. The primary molded member obtained is subjected to a primary carbonization by heating under an inert gas. Further, a pitch and/or a resin impregnation and a carbonization are repeated a required number of times to densify the primary molded member by impregnation. When the required density is obtained, the primary molded member is subjected to a graphitization by heat-treating at high temperature. The carbon fibers can be highly purified under a halogen gas atmosphere before the densification. And then the primary molded member is subjected to high purification under a halogen gas atmosphere at about 2,000 to 2,500° C. The high purification can be carried out with graphitization at the same time and in the same furnace. Also, the high purification and the graphitization can be carried out separately. Also a pitch and/or a resin can be impregnated for densification at the same time.

Then, fine pores in the surface of the molded member are impregnated with PyC by CVI with the objective of preventing reaction with SiO gas. The impregnating of PyC by CVI is carried out with 10 to 100 1/min flow of hydrocarbons or hydrocarbon compounds gas having 1 to 8 carbons at 800 to 1,300° C. under 1.33 to 13.3 kPa. In the CVI, processing time can be controlled to the required forming thickness of the impregnated PyC. The impregnated PyC layer plays a part in the buffer layer for protecting the coated PyC layer from delaminating from the substrate, and has a thickness of 5 to 20 $\mu$m, more preferably 5 to 10 $\mu$m in order to protect from forming SiC in the coated surface layer. The carbon structure of the CVI impregnated layer is mainly fine RC (Rough Columnar) structure which is needle-like.

Then, the surface coated layer of PYC is formed by CVD in order to protect from SiO gas penetrating into the inside. The CVD process is carried out at a higher temperature and a lower pressure than the CVI process in order to obtain a higher deposition rate. It is known that density of the deposited carbon increases to ideal density with a higher deposition temperature, but production cost also increases with a higher process temperature. This is against the objective of the invention. Therefore, the CVD conditions of which are temperature of 1,500 to 2,200° C., pressure of 0.13 to 1.33 kPa, keeping time of 50 to 100 hours and hydrocarbon of 1 to 8 carbons gas flow of 5 to 50 1/min may be controlled to form the required thickness. The coated layer is delaminated when it is too thick. When the coated layer is too thin, it can not prevent SiO gas permeating into the inside. The thickness of the coated layer is 10 to 100 $\mu$m, more preferably 20 to 80 $\mu$m in order to prevent forming SiC. Controlling CVD temperature can control the crystal structure of the coated PyC on the surface. Accordingly, the coefficient of thermal radiation can be 0.45 to 0.75 compared with an ideal black body by controlling the crystal structure of the PyC.

The surface roughness of the CVD coated PyC is not more than 5 $\mu$m, more preferably not more than 4 $\mu$m due to gaps in the carbon fibers on the surface being filled with the impregnated PyC by CVI. Therefore, the surface can be protected from forming to SiC due to the decreased contact surface area with SiO gas.

The density and structure of the PyC impregnated layer and the PyC coated layer can be changed by production conditions such as heating rate, substrate temperature, and gas concentration as gas type and gas flow rate. FIG. 1 (Chemistry and Physics of Carbon, Vol.5, P.47) shows the relationship between PyC density at room temperature and PyC deposition temperature for example. As shown in FIG. 1, the density of PyC at a temperature range of 800 to 1,300° C. is about 2.2 g/cm$^3$, at a temperature range of 1,300 to 1,700° C., it decreases and then increases again at a temperature over 1,700° C. to 2.2 g/cm$^3$ which is close to the ideal density of carbon. This is based on a multiplier effect with the nuclear deposition rate and the growing rate. The nuclear deposition rate and growing rate increase with higher temperature. In other words, at the high temperature stage, the PyC has a high density because the nuclei of the PyC are growing up and formatting in the same direction on the substrate. At the low temperature stage, the PyC also has a high density because the PyC nuclei are depositing and accumulating on the substrate before growing up due to the substrate temperature not being high enough for growing up of the PyC nuclei. At the middle temperature stage, the PyC density decreases and then increases again because the PyC nuclei are depositing and accumulating before accumulated nuclei on the substrate grow up and format in the same direction. Accordingly, a main factor for PyC formation is that the nuclei accumulating on the substrate at the low temperature stage and the accumulated nuclei on the substrate grow up and format in the same direction at the high temperature stage.

In the invention, the fine grain and the high density PyC is impregnated at low temperature and then the large grain and high density PyC is coated at high temperature, continuously. The resistance to delaminating of the PyC coated layer can be increased due to the density of the impregnated layer and of the coated layer being the same when impregnating and coating. Density can be controlled by controlling impregnating and coating conditions such as furnace temperature and gas concentration as gas flow and pressure.

A boundary appears between the impregnated layer and the coated layer when CVI and CVD are carried out separately. For example, this occurs when each treatment is carried out without taking the formation mechanism of the PyC into consideration, and when the C/C composite is installed again in the CVD furnace and CVD is carried out after the C/C composite is taken out for a while from the furnace and exposed in the air. Impurities in the air adsorb on the surface of the CVI layer when the C/C composite is taken out from the furnace and exposed in the air after CVI, and this causes abnormal growth, irregular formatting on the substrate and preventing growth of PyC nuclei during CVD treatment. It can be considered one of the causes of the boundary of the impregnated layer and the coated layer clearly appearing. When the boundary appears, the coated layer where it is formed in the surface by CVD is delaminated and cracks easily by thermal shock and so on. Therefore, half cuts the effect even if the impregnated layer and the coated layer are formed. Therefore, the impregnating and the coating treatment can be carried out by adjusting the conditions and carrying them out continuously in the same furnace in order to form CVI and CVD layers which have the same structure and a density difference within 0.2 g/cm$^3$ without clearing the boundary. Accordingly, the PyC of the extreme outside layer of the impregnated layer where it is formed by CVI can be nucleated by CVD treatment without the obstruction of impurities, and a new CVD coating layer can be formed.

And, it becomes possible that the thickness of the impregnated layer and the coated layer is relatively thick when CVI and CVD are carried out continuously. Delaminating of the coated layer is difficult. And the surface roughness of the C/C composite can be controlled by CVI and CVD conditions. And then, the specific surface area of the surface can be made small by making the surface roughness not more than 5 $\mu$m. In other words, contact area with air on the surface can become small, which acts to improve prevention of the formation to SiC. Furthermore, simplification of the process and stabilization of the quality can be accomplished by carrying out CVI and CVD continuously. And, a high temperature member for a single crystal pulling apparatus formed with the C/C composite, which is excellent in preventing the formation to SiC, can be provided.

While the present invention is described below more specifically with reference to the following examples, embodiments of the present invention are by no means limited to the following examples.

EXAMPLE 1

A layer of a plain weave cloth of carbon fibers (6K, made by TORAY INDUSTRIES, INC.) impregnated with phenol resin was laminated. Thereafter, the molded member was subjected to solidification by increasing the temperature of an oven up to 200° C. for 10 hours. Then, the molded member was increased in temperature up to 1,000° C. under a nitrogen atmosphere at a heating ratio of 10° C./hr in an electric oven, to obtain the C/C composite. Further, the molded member was subjected to a pitch impregnation process for densification and then was increased in temperature up to 1,000° C. at the heating ratio of 10° C./hr in the electric oven with nitrogen flow for baking. The baking process was repeated three times. Further, the molded member was heated up to 2,000° C. Thereafter, the molded member was machined into 60×10×3 mm. After the machining process, the member was further high purified at 2,000° C. for 50 hours under normal pressure of a halogen gas atmosphere. And then, for the purpose of being impregnated with pyrolytic carbon by CVI, the molded member was set in a vacuum furnace into which $CH_4$ gas was supplied at 10 1/min and maintained for 100 hours under a pressure of 1.33 kPa at 1,100° C. After CVI, for the purpose of being coated with pyrolytic carbon by CVD on the CVI impregnated layer, the molded member was heated up to 2,000° C. continuously in the same furnace and a decreased pressure to 0.5 kPa with 5 1/min of $CH_4$ gas flow and maintained for 3 hours. The average surface roughness of the sample is 1.9 $\mu$m and the coating thickness is 50 $\mu$m.

EXAMPLE 2

Except for a CVD temperature of 1,800° C., this Example is all the same as Example 1. The sample has an average surface roughness of 2.0 $\mu$m and a coating thickness of 50 $\mu$m.

EXAMPLE 3

A layer of a plain weave cloth of PAN carbon fibers (T-300 6K, made by TORAY INDUSTRIES, INC.) impregnated with phenol resin was laminated on a mandrel, followed by application of filament windings thereon. In the filament windings, with six filaments of T-300 12K (Made by TORAY INDUSTRIES, INC.) whose ash content is 76 ppm by the ash content determined method, were impregnating with phenol resin, the level winding and the parallel winding of a contact angle of 85° to 90° with respect to the center axis were alternately wound 5 layers each. While a drum is allowed to have 10 layers of the alternate parallel and level windings, the bottom is allowed to have the layers of the level windings only. As a result of this, a molded member having a layer thickness of 10 mm was obtained. Subsequently, the volatile matter of the obtained molded member was adjusted in an oven at 100° C. and, thereafter, the molded member was subjected to solidification by increasing the temperature of the oven up to 200° C. After having been subjected to solidification, the molded member was removed from the mandrel to obtain the molded member. Then, the molded member was increased in temperature up to 1,000° C. under a nitrogen atmosphere at a heating ratio of 10° C./hr in an electric oven, to obtain the C/C composite. Further, the molded member was heated up to 2,000° C. for 10 hours under a halogen gas atmosphere for the high purification process. Further, the molded member was subjected to a pitch impregnation process for densification and then was increased in temperature up to 1,000° C. at the heating ratio of 10° C./hr in the electric oven, with nitrogen flow for baking. The baking process was repeated twice. Further, the molded member was heated up again to 2,000° C. under normal pressure of a halogen gas atmosphere for graphitization and the high purification process. Thereafter, the molded member was impregnated with PyC by CVI under the same conditions of Example 1. After CVI, the molded member was heated up to 1,800° C. continuously in the same furnace and a decreased pressure to 0.5 kPa with 5 1/min of $CH_4$ gas flow and maintained for 3 hours.

The average surface roughness of the sample is 5.0 $\mu$m and the coating thickness is 50 $\mu$m.

COMPARATIVE EXAMPLE 1

Except for omission of CVI, this Example is all the same as Example 1. The sample has an average surface roughness of 5.0 $\mu$m and a coating thickness of 10 $\mu$m.

COMPARATIVE EXAMPLE 2

Except for omission of CVD, this Example is all the same as Example 1. The sample has an average surface roughness of 7.0 $\mu$m.

COMPARATIVE EXAMPLE 3

Except for omission of both CVI and CVD, this Example is all the same as Example 1.

The samples of Examples 1–3 and Comparative Examples 1–3 were installed with the metal silicon in a vacuum furnace, and a reacting examination was done at 1,800° C. under 13.3 kPa for 5 hours. After the reacting examination, a change in weight of each sample was measured and the reacting rate with SiO gas was calculated.

Furthermore, the samples of Examples 1–3 and Comparative Examples 1 and 2 were examined after a rapid heating and rapid cooling experiment. In other words, the sample was heated up to 1,000° C. in 5 min and thrown in water, and then cooled rapidly, and delaminating conditions of the PyC were examined. The number of the samples is five respectively.

The results of the reacting rate with SiO gas, the rapid heating and rapid cooling experiment and the density after each of CVI and CVD are shown in FIG. 2. The density of the PyC was calculated by degree of orientation which was calculated from specific intensity of [002] surface of carbon by X-ray diffraction.

The samples of Examples 1–3 having the density difference between the impregnated layer and the coated layer have excellent delaminating resistance and low reacting rate with SiO gas, as shown in FIG. 2. The average surface roughness of the sample of Example 3 was rougher than the samples of Examples 1 and 2, and accordingly, the reacting rate with SiO gas is high because the average surface roughness is high. The surface of the sample of Comparative Example 1 delaminated as a result of the rapid heating and rapid cooling experiment, because the surface of the sample of Comparative Example 1 was formed by only CVD. The sample of Comparative Example 2 had a high reacting rate with SiO gas as compared with the samples of Example 1–3, because the sample of Comparative Example 2 had a PyC layer formed by only CVI.

Japanese Patent Applications 10-155642, filed Jun. 4, 1998 and 11-154711, filed Jun. 2, 1999, are incorporated herein by reference.

What is claimed is:

1. A carbon fiber reinforced carbon composite, obtained by method comprising:
   (1) impregnating a pitch or a resin into molded member formed of carbon fibers for densification thereof;
   (2) forming an impregnated pyrolytic carbon layer by CVI after densification; and
   (3) forming a coated pyrolytic carbon layer on the impregnated pyrolytic carbon layer by CVD.

2. A carbon fiber reinforced carbon composite according to claim 1, wherein the molded member formed of carbon fibers after densification, is subjected to a high purification process.

3. A carbon fiber reinforced carbon composite according to claim 1, wherein density difference between the impregnated pyrolytic carbon layer and the coated pyrolytic carbon layer is not more than 0.2 g/cm$^3$.

4. A carbon fiber reinforced carbon composite according to claim 1, wherein thickness of the coated pyrolytic carbon layer is 10 to 100 µm.

5. A carbon fiber reinforced carbon composite according to claim 1, wherein average surface roughness of the coated pyrolytic carbon layer is not more than 5 µm.

6. A manufacturing method of a carbon fiber reinforced carbon composite, comprising:
   (1) impregnating a pitch or a resin into molded member formed of carbon fibers for densification thereof;
   (2) forming an impregnated pyrolytic carbon layer in a furnace by CVI after densification; and
   (3) forming a coated pyrolytic carbon layer on the impregnated pyrolytic carbon layer continuously by CVD in the same furnace of the CVI.

7. A manufacturing method of a carbon fiber reinforced carbon composite according to claim 6, wherein the molded member formed of carbon fibers, after densification, is subjected to a high purification process.

8. A manufacturing method of a carbon fiber reinforced carbon composite according to claim 6, wherein density difference between the impregnated pyrolytic carbon layer and the coated pyrolytic carbon layer is not more than 0.2 g/cm$^3$.

9. A manufacturing method of a carbon fiber reinforced carbon composite according to claim 6, wherein thickness of the coated pyrolytic carbon layer is 10 to 100 µm.

10. A manufacturing method of a carbon fiber reinforced carbon composite according to claim 6, wherein average surface roughness of the coated pyrolytic carbon layer is not more than 5 µm.

11. A pulling single crystal member made from a carbon fiber reinforced carbon composite, obtained by method comprising
   (1) impregnating a pitch or a resin into molded member formed of carbon fibers for densification thereof;
   (2) forming an impregnated pyrolytic carbon layer by CVI after densification; and
   (3) forming a coated pyrolytic carbon layer on the impregnated pyrolytic carbon layer by CVD.

12. A pulling single crystal member made from a carbon fiber reinforced carbon composite according to claim 11, wherein the molded member formed of carbon fibers, after densification, is subjected to a high purification process.

13. A pulling single crystal apparatus made from a carbon fiber reinforced carbon composite according to claim 11, wherein density difference between the impregnated pyrolytic carbon layer and the coated pyrolytic carbon layer is not more than 0.2 g/cm$^3$.

14. A pulling single crystal apparatus made from a carbon fiber reinforced carbon composite according to claim 11, wherein thickness of the coated pyrolytic carbon layer is 10 to 100 µm.

15. A pulling single crystal apparatus made from a carbon fiber reinforced carbon composite according to claim 11, wherein average surface roughness of the coated pyrolytic carbon layer is not more than 5 µm.

16. A carbon fiber reinforced carbon composite according to claim 1, wherein steps (2) and (3) are carried out continuously in the same furnace.

* * * * *